United States Patent [19]

Chen et al.

[11] 3,961,282

[45] June 1, 1976

[54] TRACKING STATUS DETECTOR FOR A DIGITAL DELAY LOCK LOOP

[75] Inventors: Chang Chung Chen, Harbor City; Jack K. Holmes, Los Angeles; James L. Lewis, Torrance, all of Calif.

[73] Assignee: The United States of America as represented by the Secretary of the Navy, Washington, D.C.

[22] Filed: Apr. 28, 1975

[21] Appl. No.: 572,557

[52] U.S. Cl. ................................. 331/1 R; 325/63; 331/18; 331/25; 331/64
[51] Int. Cl.² .......................................... H03B 3/04
[58] Field of Search ............... 331/1 R, 1 A, 18, 25, 331/64; 332/20; 325/63

[56] References Cited
UNITED STATES PATENTS

| | | | |
|---|---|---|---|
| 3,456,196 | 7/1969 | Schneider | 331/1 A X |
| 3,710,274 | 1/1973 | Basse et al. | 331/18 X |
| 3,715,751 | 2/1973 | Mead | 331/1 A X |

*Primary Examiner*—Siegfried H. Grimm
*Attorney, Agent, or Firm*—R. S. Sciascia; L. I. Shrago

[57] ABSTRACT

An unlocked detector for a digital delay lock loop employs an up-down counter which periodically accumulates the algebraic sum of the quantized positive and negative adjustments made at a preselected rate by the incremental phase modulator. Whenever this sum reaches a specified threshold value corresponding to a particular phase error, an unlocked indication is given. Arrangements utilizing the same principle are disclosed for analog loops.

9 Claims, 6 Drawing Figures

TRACKING STATUS DETECTOR FOR A DIGITAL DELAY LOCK LOOP

The present invention relates generally to phase-locked loops and, more particularly, to detectors for monitoring the status of digital or analog phase-locked loops so as to provide an indication of their locked and unlocked conditions.

When a phase-locked loop is utilized in a satellite communication system for accomplishing precise time synchronism, for example, it is imperative to know whether or not the loop is properly tracking. Conventional detectors employed for this purpose usually rely on detecting the energy in the in-phase detector output after suitable filtering. Consequently, these detectors are not very reliable when the loop is operating near its threshold. Additionally, this type of detector is sensitive to the input signal level.

It is, accordingly, a primary object of the present invention to provide a detector for indicating the tracking status of a phase-locked loop.

Another object of the present invention is to provide a circuit for indicating whether or not a digital or analog phase-locked loop is in a locked condition.

Another object of the present invention is to provide a loop tracking status detector which estimates the instantaneous phase error over a specific length of time and uses this measurement to determine if the loop is locked or is in an unlocked condition.

A still further object of the present invention is to provide a tracking status detector for a phase-locked loop which also gives a measure of the frequency offset between an input signal frequency and a local reference frequency.

Other objects, advantages and novel features of the invention will become apparent from the following detailed description of the invention when considered in conjunction with the accompanying drawings wherein.

Briefly, the tracking status detector of the present invention operates on the principle that the instantaneous phase error reflects the loop tracking status. More specifically, in the digital loop case, the instantaneous phase error between an input and reference code sequence is translated into binary signals which are sent to an up-down counter at a particular sampling rate. When the loop is in lock, the positive and negative counts registered in the counter essentially cancel leaving a residual error that is small. However, when the loop is unlocked, the counter quickly proceeds to accumulate to a value greater than a preset threshold value corresponding to a specific phase error. Thus, whenever this threshold value is reached within a selected time interval, an unlocked indication is given. A second up-down counter fed in a similar manner has its count averaged over a longer time interval to provide a measure of the drift between the input signal frequency and the reference signal frequency.

Figure 1:
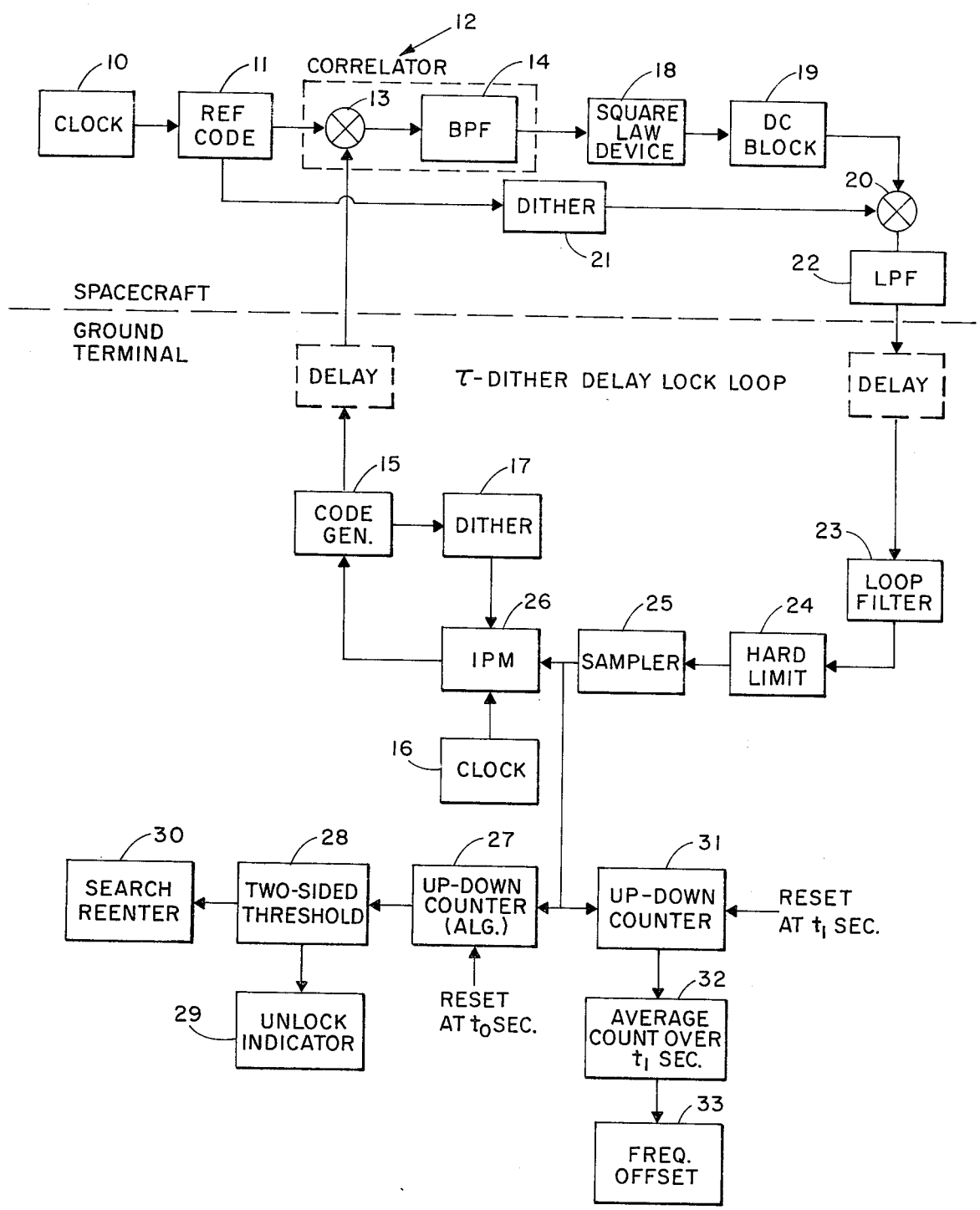
FIG. 1 is a block diagram of a digital delay locked loop monitored with a tracking status detector employing the operating principle of the present invention.

Referring not to FIG. 1 of the drawings, which illustrates the tracking status detector of the present invention associated with a $\tau$-dither delay locked loop in a satellite communication system, it will be seen that the spacecraft part of the system, that is, that portion of the block diagram above the horizontal line, consists of a clock 10 which serves as the timing mechanism for a reference code generator 11 which produces a PN code sequence that is fed to one input of a correlator 12. This correlator consists of a multiplying circuit 13 and a bandpass filter 14 connected in series. The oher input to this correlator is the input code sequence from the ground terminal which is obtained from code generator 15 under the control of a local clock 16 and an incremental phase modulator 26. This code is $\tau$-dithered by a square wave from source 17 there $\tau$ is the dither amplitude which is typically 0.1 chips.

The dither corrupted error signal present in the output of correlator 12, as a result of the phase misalignment between the correlated signals, is squared in circuit 18, and the DC value of the resultant is removed by a DC blocking device 19. Thereafter, the AC signal component is fed to a multiplier 20 which has as its other input a square wave signal obtained from dither circuit 21 which is the counterpart of circuit 17 at the ground terminal. Dither circuit 21 is under the control of the reference code generator 11, and the multiplication process removes the dither present in the error signal.

The output of multiplier 20 after low-pass filtering in 22 is transmitted to the ground terminal where it is processed by a loop filter 23 and a hard limiter 24.

It would be noted that the phase error is the algebraic difference of the reference code and the signal received from the ground terminal. However, due to the characteristics of the $\tau$-dither loop, the actual loop control error signal is a non-linear function of the phase error. More specifically, the true timing error is linear for small errors, then limits and returns to zero just past the one full chip condition.

The output from hard limiter output 24 is applied to a sampler 25 which functions to form negative or positive pulses depending upon the sign of the phase error. These binary signals control an incremental phase modulator 26 which updates the phase of the signal produced by local code generator 15. In doing so, it adds or subtracts a fraction of a chip, $\Delta$, to the nominal periodic output waveform of T seconds duration. The incremental phase modulator 26 is, thus, the functional equivalent of a limited-input analog voltage control oscillator, responding only to the algebraic sign of the pulse present at its input circuit.

The unlock detector portion of the system is essentially a counter which estimates the actual phase error. More specifically, the output of sampler 25 is fed to an up-down counter 27. When the loop is in lock, the up counts registered therein are essentially equal to the down counts except for any slow drift due to frequency differences between the satellite and ground terminal clocks 10 and 16. Since up-down counter 27 is reset every $t_o$ seconds, $t_o$ is selected such that the frequency error between these clocks $\Delta f$ satisfies the relationship $\Delta f\, t_o \ll 1$. Under these conditions, the drift is negligible and the counter's accumulated value is an estimate of the true code phase error.

Whenever the loop is unlocked, the counter quickly proceeds to register progressively higher values. A particular threshold count can be set to correspond to any desired positive or negative phase error value. Thus, counter 27 has associated with it a two-side threshold arrangement 28 which established these threshold values N and −N. Whenever either of these values are reached, unlocked indicator 29 is activated. At the same time, a search re-enter system 30 becomes effective to institute acquisition of the incoming signal by search techniques similar to those utilized in analog systems.

Figure 2:
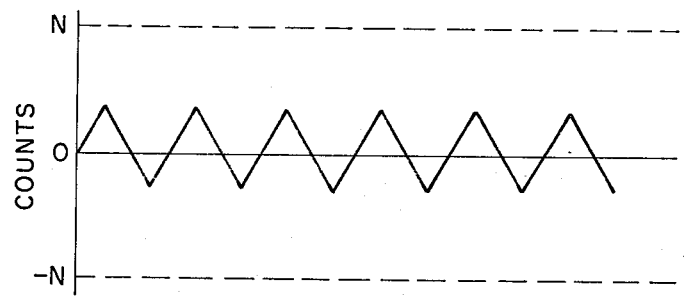
FIG. 2 shows the performance of the up-down counter of the detector when the loop is tracking.

FIG. 2 illustrates the phase error expressed in error counts for the in-lock case. The delay in the loop due to, for example, filters or the propagation time between the ground terminal in the noiseless case produces a triangular shape phase error variation with time. The period of the triangular function is four times the loop delay. It will be seen that the count oscillates back and forth and never reaches the threshold ±N even without being reset.

Figure 3:
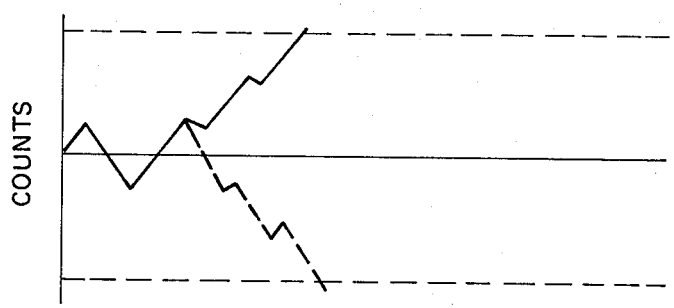
FIG. 3 shows the behavior of this counter when the loop is not tracking.

FIG. 3 illustrates the situation where the loop is unlocked. Now the count quickly accumulates to the positive or negative threshold, and this occurs within a time interval that is short compared to $t_o$, the period between reset pulses. For a threshold of ±½ chip, the time to respond to an unlocked condition $T_{OL} = \frac{1}{2}/(R_s\Delta)$, where $R_s$ equals the sampling rate and $\Delta$ is the phase step modification size in chips.

When the loop is in lock and tracking, the incoming code sequence from the ground terminal and the reference code sequence may have different clock frequencies. To determine this drift, the output from sampler 25 is also fed to a second up-down counter 31. The count so registered is averaged over a predetermined time interval $t_1$ which is longer than the reset time, $t_o$, for counter 27. This average count is translated into a frequency offset measurement by circuit 33. Any suitable arrangement can be associated with this portion of the system to provide an appropriate display or alarm when this drift exceeds an acceptable amount. Manual or automatic means may be employed to correct the frequency of clock 16.

Figure 4:
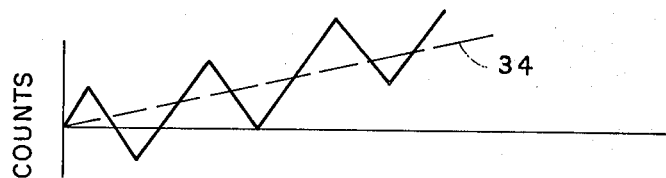
FIG. 4 shows the operation of the counter when the loop is tracking with a frequency error.

FIG. 4 illustrates the accumulated count when the loop is tracking but with such a frequency error. It will be appreciated that the triangular waveforms are now skewed with respect to the horizontal axis and the slope of axis 34 is indicative of the magnitude of the frequency drift.

The system discussed above has been analyzed by a MARKOV random walk model and two sets of probabilities were determined. The first was the probability of detecting the unlocked condition given that the loop was unlocked. At a signal-to-noise ratio 6 DB, it was found that the probability of detection was 0.9999. The second performance parameter was the probability of exceeding the threshold given that the loop was in lock. At the same signal-to-noise ratio, it was found that the probability of one or more false alarms in one year was less than $10^{-5}$. The frequency drift estimator was found to provide frequency estimates with root mean square errors on the order of $10^{-10}$.

Figure 5:
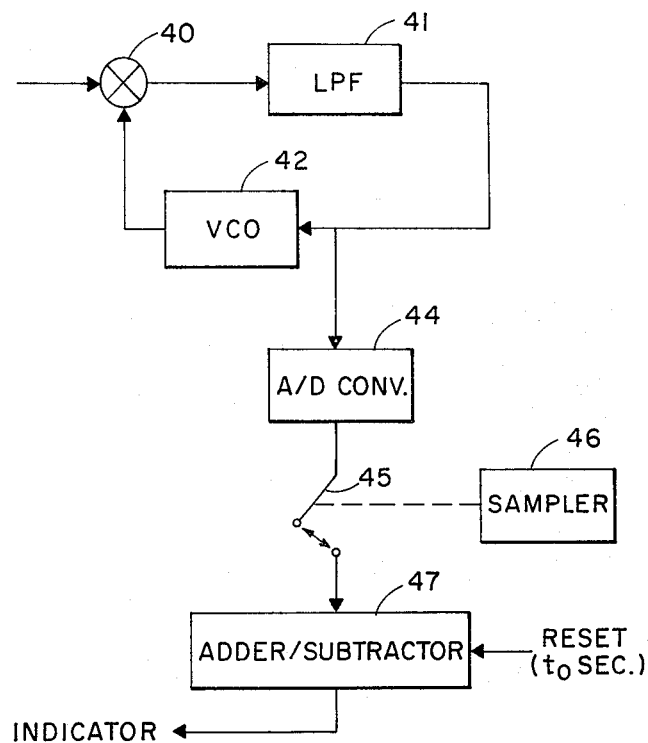
FIG. 5 is a box diagram showing how the operating principle of the tracking detector may be employed to monitor an analog loop.

The locked detector principle of the present invention can be utilized with analog loops as well as with digital loops. FIG. 5 illustrates one such arrangement similar to that employed in the digital loop case. Here, the loop, which is shown in simplified form, consists of a multiplier 40 having the input signal applied to one of its inputs, a low-pass filter 41 and a voltage control oscillator 42 connected in the usual manner. The analog phase error present in the loop is converted to a digital signal by an analog-to-digital converter 44. The resultant digital signal is sampled by switch 45 under the control of circuit 46 which periodically opens and closes this switch according to a predetermined schedule. In thie manner, the analog phase error signal is quantized to a fixed number of bits, and when these bits are summed in the adder/subtractor 47, the valve registered therein is proportional to the existing phase error at the current time.

Figure 6:
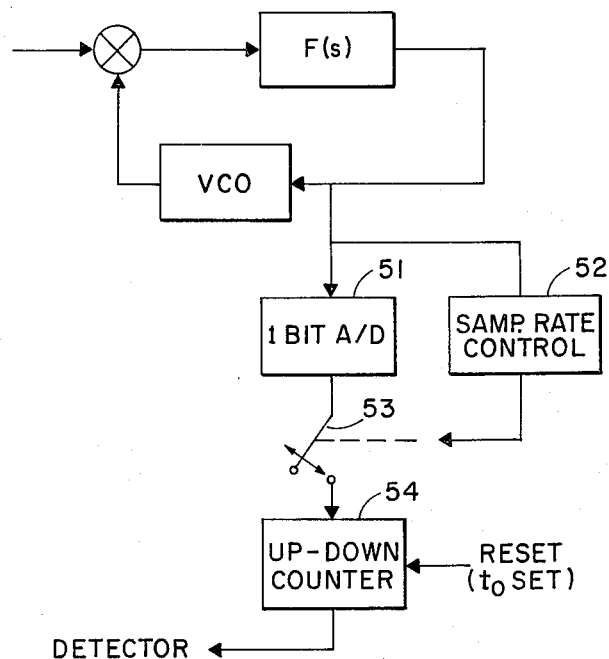
FIG. 6 is an alternative arrangement for monitoring a similar analog loop.

FIG. 6 shows an alternative arrangement where the analog phase error signal is converted to a single bit by a one-bit analog-digital converter 51. This bit is sampled by switch 53 under the control of circuit 52 in a manner such that the sampling rate is determined by the magnitude of the error signal. The sample signals are sent to an up-down counter 54, and, again, the count registered therein is approximately proportional to the phase error. This arrangement has the advantage that the processing is confined to one-bit samples. However, it does not possess the accuracy of the method employed in the apparatus of FIG. 6.

What is claimed is:

1. Apparatus for monitoring the tracking status of a digital phase-locked loop of the type wherein an incremental phase modulator periodically makes either a positive adjustment to pulses generated within said loop which increases their duration by a fractional amount or a negative adjustment which decreases their duration by the same fractional amount, comprising in combination means for registering the algebraic sum of the positive and negative adjustments made by said incremental phase modulator during mutually exclusive first time intervals; and means for providing an indication whenever said sum reaches predetermined equal positive or negative threshold values, said indication designating an unlocked condition of said loop.

2. In an arrangement as defined in claim 1 wherein the pulses generated within said loop and the pulses applied to said loop which are to be phase locked have their pulse lengths determined in part by a pair of clocks having the same frequency; and means for registering the algebraic sum of the positive and negative adjustments made by said incremental phase modulator during mutually exclusive second time intervals which are longer than said first time intervals, the sum thus recorded being indicative of the drift between the frequencies of said clocks.

3. In a method for monitoring the tracking status of a digital phase-locked loop which contains an incremental phase modulator which periodically makes positive and negative adjustments to the pulses generated within said loop so as to increase or decrease their lengths by fractional amounts, the steps of determining the algebraic sum of the positive and negative adjustments that are made during successive time intervals of equal lengths; and indicating whenever this sum attains a particular threshold value which is selected to correspond to a specific amount of misalignment between the pulses being phase locked.

4. Apparatus for monitoring the tracking status of a digital phase-locked loop of the type in which the phase error signal developed therein has a sign indicative of the direction of misalignment between reference pulses generated within said loop and pulses applied to said loop, comprising in combination means for converting said phase error signal into control pulses of uniform amplitude which are either positive or negative depending upon the sign of said phase error signal, said control pulses having a preselected pulse repetition rate;

an up-down counter;

means for feeding said control pulses to said counter;

means for periodically resetting said counter to zero; and means for providing an indication whenever the count registered by said counter reaches a predetermined value.

5. In a system for indicating the tracking status of a digital phase-locked loop of the type wherein a reference pulse sequence is generated within the loop, and an incremental phase modulator acts to maintain time synchronism between this reference pulse sequence and a similar pulse sequence fed to the loop by periodically making positive or negative adjustments to the reference pulses so as to correspondingly increase or decrease their durations by fractional amounts, the combination of means for determining the algebraic sum of the positive and negative adjustments which are made by said incremental phase modulator during mutually exclusive time intervals of equal duration; and means for providing an indication that the digital phase-locked loop is in an unlocked condition whenever said sum reaches a predetermined threshold value.

6. In an arrangement as defined in claim 5 wherein said means for determining the algebraic sum of the positive and negative adjustments made by said incremental phase modulator includes an up-down counter having positive and negative control pulses derived from the phase error signal developed within said loop applied thereto at a predetermined pulse repetition rate.

7. Apparatus for monitoring the tracking status of an analog phase-locked loop of the type wherein a voltage controlled oscillator is adjusted by a phase error signal developed within the loop, comprising in combination means for converting said phase error signal into a digital signal which is indicative of the sign and amplitude of said phase error signal;

an adder-subtractor;

means for applying said digital signal to said adder-subtractor at a specified rate; and means for indicating whenever the quantity registered in said adder-subtractor reaches a predetermined value within mutually exclusive, equal time intervals.

8. Apparatus for monitoring the status of an analog phase-locked loop of the type where the phase error signal developed therein has a sign and magnitude indicative of the direction and amount of the phase misalignment between the signals being phase locked, comprising in combination means for converting said phase error signal into a digital code;

an adder-subtractor circuit;

means for applying said digital code to said adder-subtractor circuit at specified times;

means for periodically resetting said adder-subtractor circuit to zero; and means for indicating whenever the quantity registered in said adder-subtractor reaches a threshold value.

9. Apparatus for monitoring the tracking status of an analog phase-locked loop of the type that has a voltage controlled oscillator therein which is regulated by a phase error signal whose sign and amplitude represent the direction and amount of phase displacement between the two signals involved in the phase-locked process, comprising means for converting said phase error signal into a one-bit binary code, said bit being positive or negative depending upon the sign of said phase error signal;

an up-down counter; and means for feeding said one-bit binary code to said up-down counter at a rate governed by the amplitude of said phase error signal;

means for periodically resetting said up-down counter to zero; and means for providing an indication whenever the count registered in said up-down counter reaches a preselected threshold value.

* * * * *